United States Patent
Tada et al.

(10) Patent No.: US 9,549,495 B2
(45) Date of Patent: Jan. 17, 2017

(54) COMPONENT MOUNTING SYSTEM

(71) Applicant: Panasonic Corporation, Osaka (JP)

(72) Inventors: Shogo Tada, Yamanashi (JP);
Shin-ichiro Endo, Yamanashi (JP);
Toru Chikuma, Yamanashi (JP);
Daisuke Mizokami, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 228 days.

(21) Appl. No.: 14/313,107

(22) Filed: Jun. 24, 2014

(65) Prior Publication Data
US 2015/0013152 A1    Jan. 15, 2015

(30) Foreign Application Priority Data
Jul. 5, 2013    (JP) .................................. 2013-141482

(51) Int. Cl.
*H05K 13/08* (2006.01)
*H05K 13/04* (2006.01)

(52) U.S. Cl.
CPC .......... *H05K 13/08* (2013.01); *H05K 13/0404* (2013.01); *Y10T 29/53174* (2015.01)

(58) Field of Classification Search
CPC ................ H05K 13/08; H05K 13/0404; Y10T 29/53174
See application file for complete search history.

(56) References Cited

U.S. PATENT DOCUMENTS

2005/0258381 A1* 11/2005 Kawase ............. H05K 13/0408
250/559.45

FOREIGN PATENT DOCUMENTS

| EP | 2838332 A1 | 2/2015 |
| JP | 2002-280798 A | 9/2002 |
| JP | 2007-061699 A | 3/2007 |
| JP | 2011-003679 A | 1/2011 |
| WO | 2013/153598 A1 | 10/2013 |

* cited by examiner

Primary Examiner — Peter DungBa Vo
Assistant Examiner — Jeffrey T Carley
(74) Attorney, Agent, or Firm — Pearne & Gordon LLP

(57) ABSTRACT

A component mounting system includes: a component mounter that moves a mounting head and allows a suction nozzle mounted in the mounting head to suck a component supplied by a parts feeder to mount the component on a substrate; a head maintenance device that executes maintenance of the mounting head; an inspection section that inspects a state of the mounting head undergone the maintenance; a use suitability determination section that determines whether or not use of the mounting head undergone the maintenance is suitable based on a result of the inspection; and a registration section that registers the mounting head determined to be not suitable for use.

4 Claims, 13 Drawing Sheets

COMPONENT MOUNTING SYSTEM

CROSS REFERENCE TO RELATED APPLICATION(S)

The present disclosure relates to the subject matters contained in Japanese Patent Application No. 2013-141482 filed on Jul. 5, 2013, which are incorporated herein by reference in its entirety.

FIELD

Exemplary embodiments of the present invention relate to a component mounting system including a component mounter, which moves a mounting head by a head moving mechanism and allows a suction nozzle provided in the mounting head to suck a component supplied by a parts feeder to mount the component on a substrate.

BACKGROUND

A component mounter which constitutes a component mounting system moves a mounting head by a head moving mechanism and allows a plurality of suction nozzles provided in the mounting head to suck components supplied by a parts feeder to mount the components on a substrate. It is necessary to perform maintenance regularly on the mounting head (each shaft member) of the component mounter. As a head maintenance device which performs maintenance, for example, a head maintenance device is known, in which an operator detaches the mounting head from the head moving mechanism of the component mounter and sets the mounting head on the pedestal of the maintenance device, and a washing liquid and grease flow into an air pipeline corresponding to each shaft member to wash the shaft members (for example, see Patent Document 1).

Patent Document 1 is JP-A-2011-3679.

SUMMARY

However, in the head maintenance device of the related art, since a shaft member after the execution of the maintenance is used for a mounting operation of components, when there is a shaft member undergone insufficient maintenance, there is concern that component mounting precision of the component mounter is degraded.

Accordingly, embodiments of the invention aim to provide a component mounting system capable of preventing degradation in mounting precision of components even when there is a shaft member undergone insufficient maintenance in a mounting head of a component mounter.

(1) There is provided a component mounting system including: a component mounter that moves a mounting head by a head moving mechanism and allows a suction nozzle mounted in the mounting head to suck a component supplied by a parts feeder to mount the component on a substrate; a head maintenance device that executes maintenance of the mounting head; an inspection section that inspects a state of the mounting head undergone the maintenance by the head maintenance device; a use suitability determination section that determines whether or not use of the mounting head undergone the maintenance by the head maintenance device is suitable based on a result of the inspection by the inspection section; and a registration section that registers the mounting head determined to be not suitable for use by the use suitability determination section, wherein use of the mounting head registered by the registration section is restricted in the component mounter.

(2) There is provided a component mounting system according to (1), wherein the mounting head has a plurality of shaft members and sliding members slidably attached to the shaft members, the maintenance which is executed by the head maintenance device is cleaning of sliding portions between the shaft members and the sliding members, the inspection which is performed by the inspection section is inspection of sliding states of the sliding members with respect to the shaft members.

(3) There is provided a component mounting system according to (1) or (2), wherein the head maintenance device is attached to a feeder base, which is a holding portion of the parts feeder provided in the component mounter, to be replaceable with the parts feeder.

In the embodiments, after the maintenance of the mounting head provided in the component mounter is executed by the head maintenance device, the inspection of the state of the mounting head is performed, and as a result, a mounting head determined to be not suitable for use is registered and the use of the mounting head is restricted. For this reason, it is possible to prevent degradation in mounting precision of components even when the maintenance of the mounting head of the component mounter is insufficient.

DETAILED DESCRIPTION OF THE EMBODIMENTS

Figure 1:
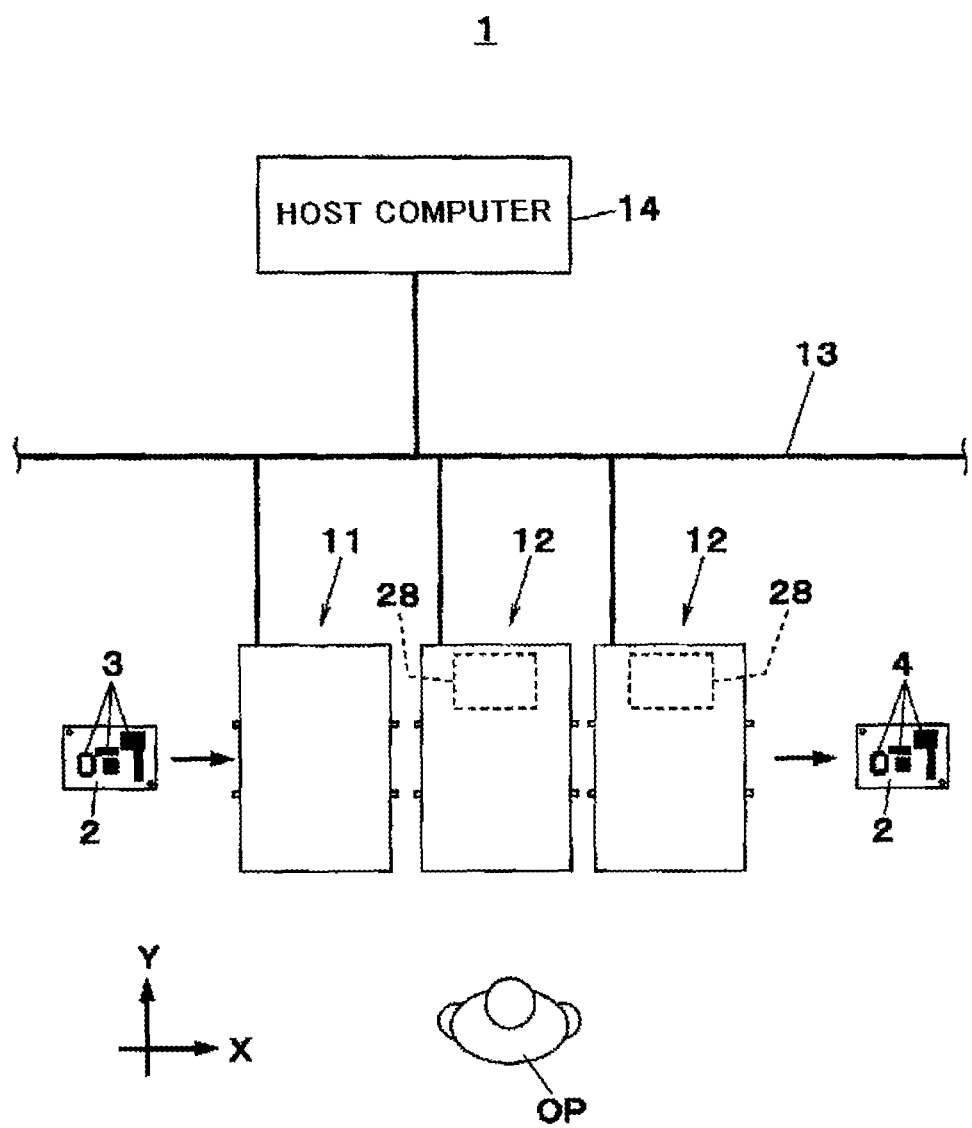
FIG. 1 is a configuration diagram of a component mounting system according to an embodiment of the invention.

Hereinafter, an embodiment of the invention will be described referring to the drawings. A component mounting system 1 shown in FIG. 1 mounts components 4 on electrodes 3 of the substrate 2, and includes a solder printer 11 and a plurality of component mounters 12. The solder printer 11 and a plurality of component mounters 12 are disposed in this order from an upstream process side, the solder printer 11 prints a solder on each electrode 3 of the substrate 2, and each of the component mounters 12 mounts the components 4 on the electrodes 3 of the substrate 2 on which the solder is printed by the solder printer 11.

Each of the solder printer 11 and a plurality of component mounters 12 is connected to a host computer 14 through a communication line 13. In this embodiment, the conveying direction (a right and left direction viewed from an operator OP) of the substrate 2 in the component mounting system 1 is referred to as an X-axis direction, and a horizontal in-plane direction orthogonal to the X-axis direction (a forth-back direction viewed from the operator OP) is referred to as a Y-axis direction. A vertical direction is referred to as a Z-axis direction.

Figure 2:
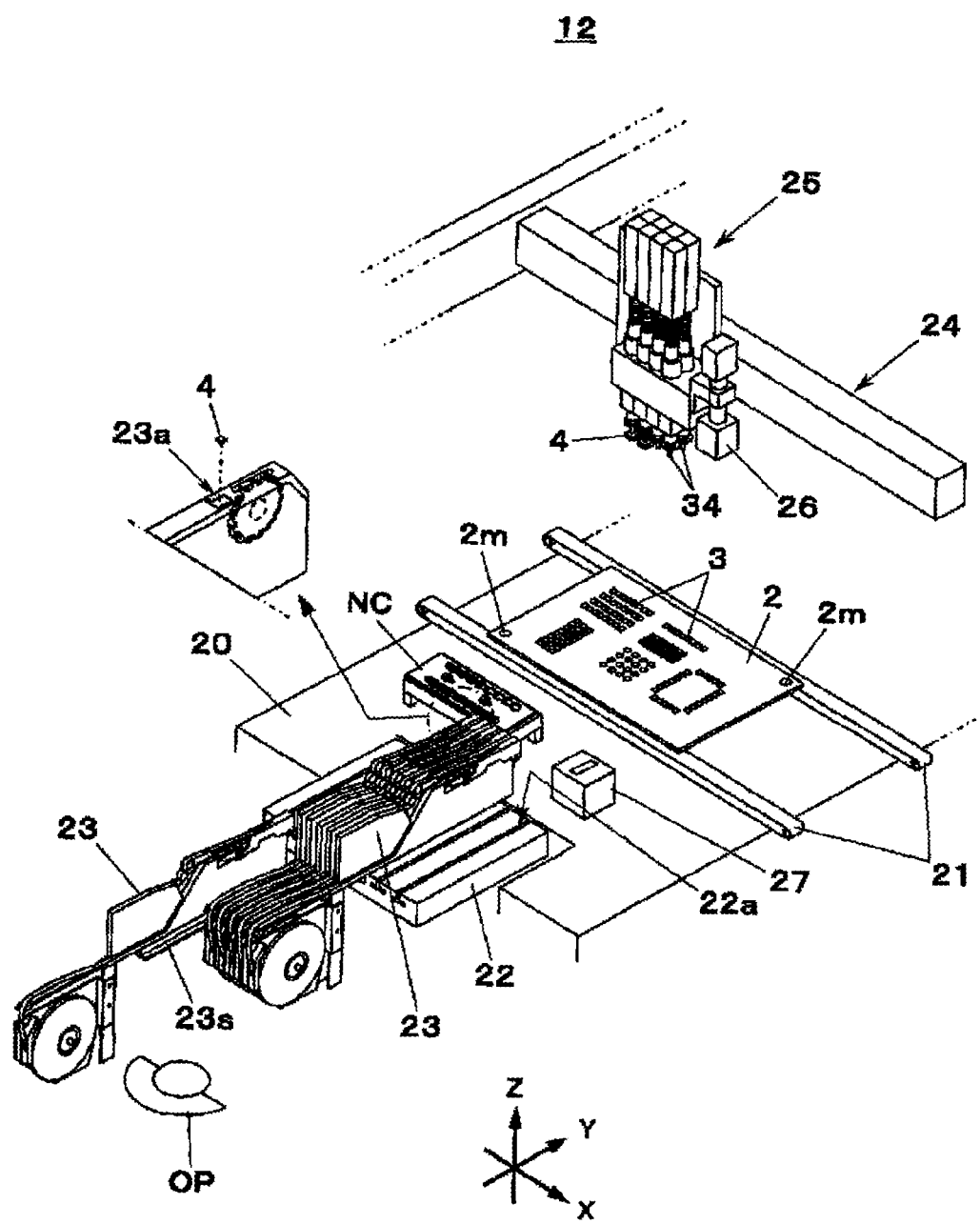
FIG. 2 is a perspective view of a main part of a component mounter which constitutes the component mounting system according to the embodiment of the invention.

In FIG. 2, each component mounter 12 is provided on a base 20 in a horizontal posture, and includes a pair of substrate conveyers 21 which convey the substrate 2 received from the solder printer 11 in the X-axis direction, a feeder base 22 which is coupled to the base 20 on a side of the substrate conveyers 21, a plurality of parts feeders 23 which serve as component supply means detachably attached to the feeder base 22, a head moving mechanism 24 which has an XY robot, a mounting head 25 which is provided movably above the substrate conveyers 21 by the head moving mechanism 24, a substrate camera 26 attached to the mounting head 25, a component camera 27 which is provided between the substrate conveyers 21 and the parts feeder 23, and a control device 28 (FIG. 1) which performs operation control of these respective units.

Each parts feeder 23 has, for example, a tape feeder, and supplies the components 4 to be mounted on the substrate 2 by the mounting head 25 to a component supply port 23a (the enlarged view of FIG. 2). On the lower surface of the parts feeder 23, a slot inserting portion 23s having an inverse "T"-shaped section is provided to extend in the Y-axis direction. The slot inserting portion 23s is inserted into a slot 22a, which is provided in the upper surface of the feeder base 22 to extend in the Y-axis direction, in the horizontal direction, whereby the parts feeder 23 is attached to the feeder base 22.

Figure 3:
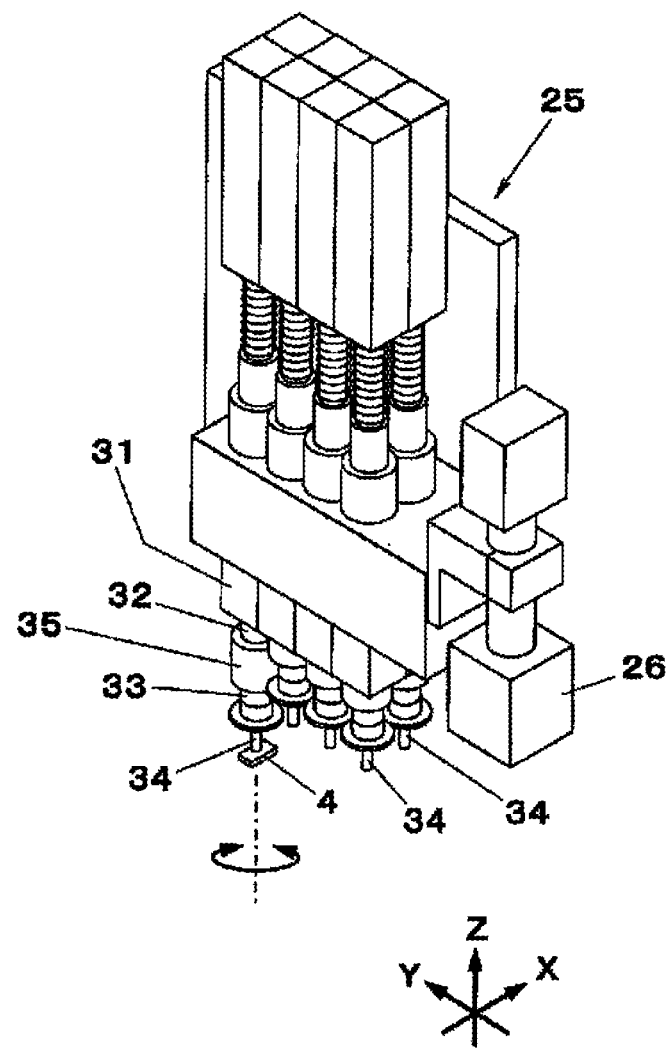
FIG. 3 is a perspective view of a mounting head provided in the component mounter according to the embodiment of the invention.
Figure 4A:
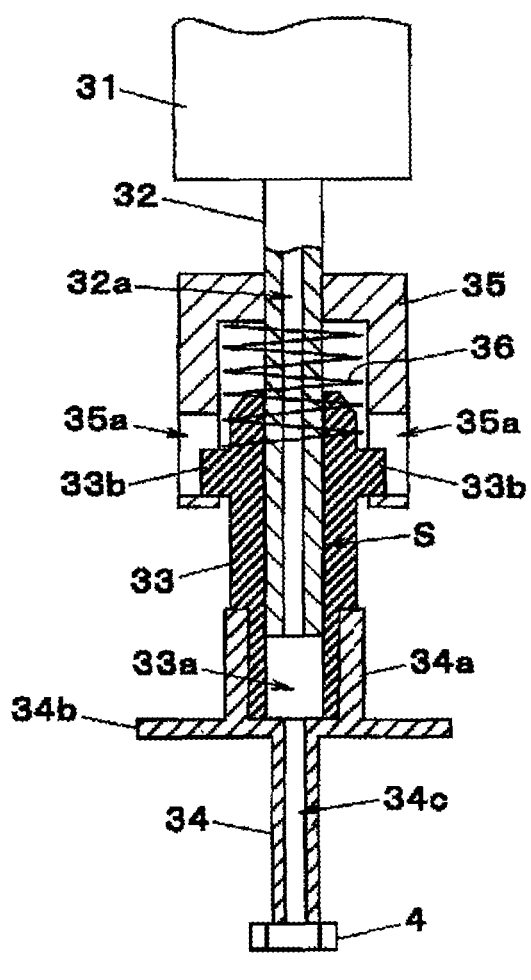
FIGS. 4A and 4B are partial enlarged partial sectional views of a mounting head according to the embodiment of the invention.
Figure 4B:
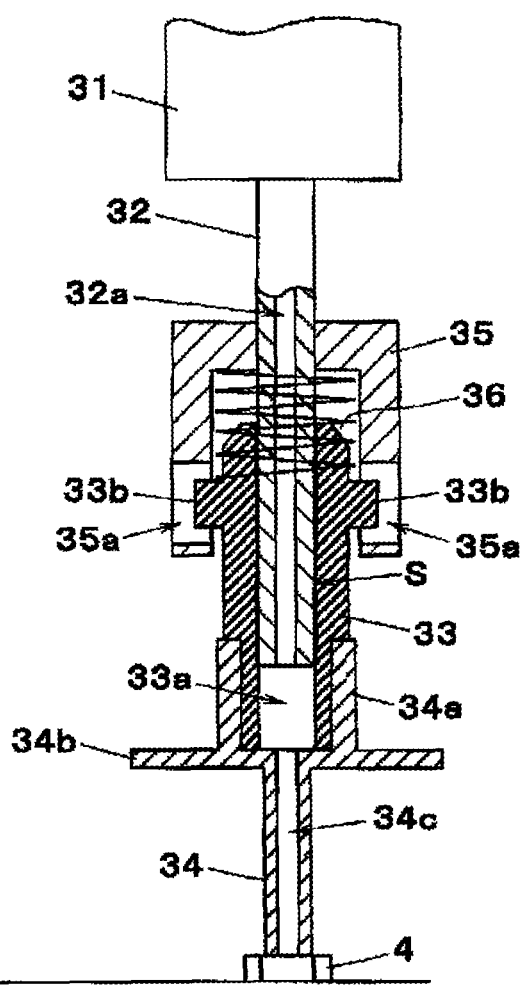

In FIGS. 3, 4A, and 4B, a plurality of hollow shaft member holding portions 31 are provided in the mounting head 25 to extend downward, and inside each shaft member holding portion 31, a hollow shaft member 32 which includes a suction pipeline 32a extending in the Z-axis direction is provided vertically movably and rotatably around the Z axis with respect to the shaft member holding portion 31.

In FIGS. 4A and 4B, a nozzle holder 33 serving as a sliding member is attached to the lower end of each shaft member 32 to be detachable with respect to the shaft member 32. The nozzle holder 33 has a cylindrical internal space 33a, and the shaft member 32 enters the internal space 33a from the above. The inner diameter of the internal space 33a of the nozzle holder 33 is slightly greater than the outer diameter of the shaft member 32, and for this reason, the nozzle holder 33 is slidable in the vertical direction along the outer circumferential surface of the shaft member 32.

In FIGS. 3, 4A, and 4B, a suction nozzle 34 is attached to the lower end of the nozzle holder 33 to extend downward. That is, in this embodiment, the mounting head 25 has a configuration in which the suction nozzle 34 is detachably attached.

In FIGS. 4A and 4B, the suction nozzle 34 has a disc-like flange portion 34b in the lower portion of an external fitting portion 34a which is externally fitted to the lower end of the nozzle holder 33. Inside the suction nozzle 34, an intra-nozzle pipeline 34c is provided to extend in the vertical direction, and in a state where the external fitting portion 34a of the suction nozzle 34 is externally fitted to the lower end of the nozzle holder 33, the intra-nozzle pipeline 34c of the suction nozzle 34 communicates with the suction pipeline 32a inside the shaft member 32 through the internal space 33a of the nozzle holder 33. For this reason, if a vacuum pressure is supplied inside the suction pipeline 32a of the shaft member 32 in a state where the suction nozzle 34 is attached to the nozzle holder 33, the vacuum pressure is also supplied inside the intra-nozzle pipeline 34c of the suction nozzle 34, and if the component 4 is brought into contact with (or close to) the lower end of the suction nozzle 34 in this state, the component 4 is sucked to the lower end of the suction nozzle 34. If the supply of the vacuum pressure inside the suction pipeline 32a of the shaft member 32 is stopped in a state where the component 4 is sucked to the lower end of the suction nozzle 34 and the vacuum is released, the component 4 is separated from the lower end of the suction nozzle 34.

In FIGS. 4A and 4B, a tubular spring accommodating member 35 which is opened downward is attached to the outer circumferential surface of the shaft member 32, and a compression spring 36 is accommodated in the spring accommodating member 35. The compression spring 36 energizes the nozzle holder 33 downward with respect to the shaft member 32.

As shown in FIG. 4A, the nozzle holder 33 is provided with a pair of protrusions 33b which extend laterally, and a pair of protrusions 33b are movable in the vertical direction in protrusion moving grooves 35a which are provided in a portion of the lateral surface of the spring accommodating member 35 to extend in the vertical direction. For this reason, in a state where a pressing force is not applied upward to the lower end of the suction nozzle 34, the lower ends of the protrusions 33b of the nozzle holder 33 are in contact with the lower edges of the protrusion moving grooves 35a of the spring accommodating member 35 from the above. Meanwhile, if the pressing force is applied upward to the lower end of the suction nozzle 34, as shown in FIG. 4B, the nozzle holder 33 is moved upward by the pressing force against the energizing force of the compression spring 36. However, the upward movement of the nozzle holder 33 is restricted on the upper limit where the protrusions 33b come into contact with the upper edges of the protrusion moving grooves 35a from below.

In FIG. 2, the substrate camera 26 is attached to the mounting head 25 in a state where an imaging visual field is directed downward, and moves along with the mounting head 25, and images a pair of substrate marks 2m on the substrate 2 positioned by the substrate conveyers 21 from the above. The component camera 27 is provided on the base 20 in a state where an imaging visual field is directed upward, and images the component 4, which passes the upper side in a state of being sucked by the suction nozzle 34 of the mounting head 25, from below.

Figure 5:
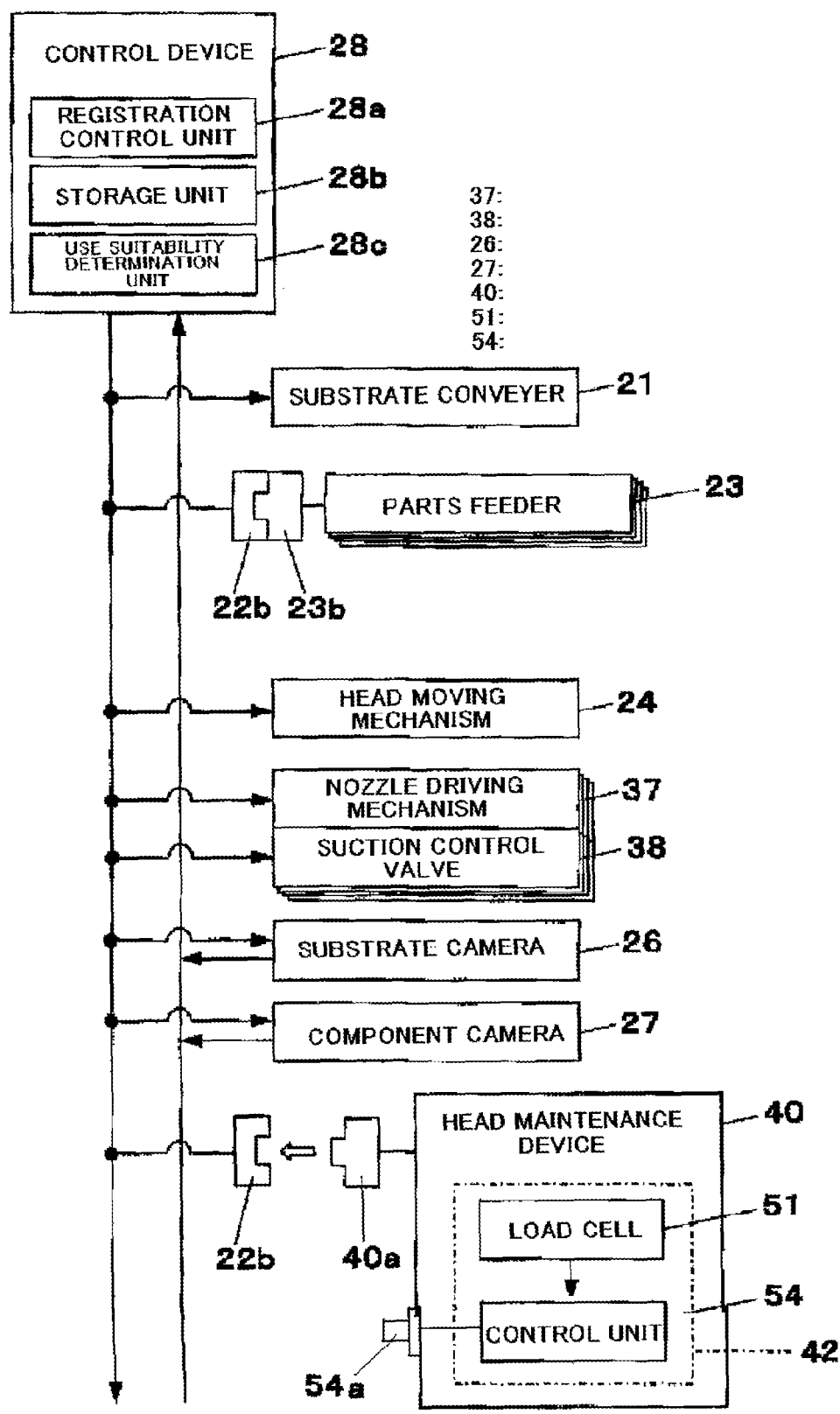
FIG. 5 is a block diagram showing a control system of the component mounter according to the embodiment of the invention.

The conveying and positioning operation of the substrate 2 by the substrate conveyers 21 is made through the operation control of the substrate conveyers 21 by the control device 28 (FIG. 5). Each of a plurality of parts feeders 23 attached to the feeder base 22 undergoes the operation control by the control device 28 and supplies the components 4 to the component supply port 23a. In FIG. 5, each parts feeder 23 has a feeder-side connector 23b, and if the parts feeder 23 is attached to the feeder base 22, the feeder-side connector 23b is fitted to a feeder base-side connector 22b provided on the feeder base 22 side, whereby signal transmission between the parts feeder 23 and the control device 28 is enabled (FIG. 5).

The moving operation of the mounting head 25 is made through the operation control of the head moving mechanism 24 by the control device 28, and the elevating and rotating operation of each shaft member 32 with respect to the mounting head 25 is made through the operation control of a nozzle driving mechanism 37 (FIG. 5) provided for each shaft member 32 by the control device 28. The sucking operation of the component 4 by the mounting head 25 using the suction nozzle 34 is made through the operation control of a suction control valve 38 (FIG. 5) provided for each shaft member 32 by the control device 28.

In FIG. 5, the control of the imaging operation of the substrate camera 26 and the control of the imaging operation of the component camera 27 are made by the control device 28, and image data of the substrate marks 2m obtained by the imaging operation of the substrate camera 26 and image data of the component 4 obtained by the imaging operation of the component camera 27 are transmitted to the control device 28. The control device 28 performs image recognition based on image data of the substrate marks 2m obtained by the imaging of the substrate camera 26 to recognize the position of the substrate 2, and performs image recognition based on image data of the component 4 obtained by the imaging of the component camera 27 to recognize the posture or the like of the component 4 with respect to the suction nozzle 34.

Next, a procedure when each component mounter 12 executes a component mounting operation to mount the components 4 on the electrodes 3 of the substrate 2 will be described. When the component mounter 12 performs the component mounting operation, first, the control device 28 operates the substrate conveyers 21 to carry the substrate 2 sent from the solder printer 11 on the upstream process side of the component mounter 12, to stop the substrate 2 at a predetermined operation position, and to position the substrate 2.

The control device 28 moves the mounting head 25 to place the substrate camera 26 above the substrate 2 after the substrate 2 is positioned, and causes the substrate camera 26 to image a pair of substrate marks 2m on the substrate 2, thereby recognizing the position of the substrate 2. The recognized position of the substrate 2 is compared with a preset reference position, thereby obtaining the displacement of the substrate 2 from the reference position.

After the displacement of the substrate 2 from the reference position is obtained, the control device 28 performs the operation control of each parts feeder 23 to supply the component 4, and moves the suction nozzle 34 attached to the mounting head 25 vertically above the component supply port 23a of the parts feeder 23, whereby the component 4 is sucked by the suction nozzle 34.

The control device 28 moves the mounting head 25 after the component 4 is sucked by the suction nozzle 34 such that the component 4 passes the upper side of the component camera 27. The component 4 is imaged by the component camera 27 to recognize the posture or the like of the component 4, and the displacement of the component 4 with respect to the suction nozzle 34 is calculated. The control device 28 moves the mounting head 25 above the substrate 2 after the posture or the like of the component 4 is recognized, and mounts the component 4 sucked by the suction nozzle 34 on the electrode 3 of the substrate 2. At this time, the control device 28 corrects the position and rotation direction of the suction nozzle 34 such that the calculated displacement of the substrate 2 and the displacement of the component 4 with respect to the suction nozzle 34 are cancelled.

The control device 28 repeats the above-described procedure to mount the components 4 on the electrodes 3 of the substrate 2. After all components 4 to be mounted are mounted on the substrate 2, the substrate conveyers 21 are operated to carry the substrate 2 out of the component mounter 12.

In the above-described component mounting operation by the component mounter 12, when mounting the component 4 sucked by the suction nozzle 34 on the substrate 2, the control device 28 moves down the shaft member 32 with respect to the mounting head 25 such that the component 4 sucked by the suction nozzle 34 is pressed onto the electrode 3 of the substrate 2 (FIG. 4A to FIG. 4B). At this time, a reaction force from the substrate 2 is applied to the lower end of the suction nozzle 34, and the nozzle holder 33 slides upward with respect to the shaft member 32 against the energizing force of the compression spring 36. The sliding of the nozzle holder 33 with respect to the shaft member 32 fulfills a buffer function between the shaft member 32 and the nozzle holder 33, and since a force which is transmitted from the shaft member 32 to the component 4 is reduced, the component 4 is prevented from being pressed to the substrate 2 by an excessive force.

On the other hand, a minute foreign substance may enter a small spacing S between the nozzle holder 33 and the shaft member 32 shown in FIGS. 4A and 4B, and in this case, smooth sliding of the nozzle holder 33 with respect to the shaft member 32 is obstructed. Then, a force which is transmitted from the shaft member 32 to the component 4 when mounting the component 4 on the substrate 2 increases compared to the normal operation, and when the suction nozzle 34 sucks the component 4 at a position deviated from the center of the component 4, a force which causes the component 4 to be deviated in the horizontal direction when pressing the component 4 is generated, and the component 4 is pushed in the horizontal direction, whereby the displacement of the component 4 with respect to the electrode 3 occurs. The sliding is obstructed and component suction and mounting at a normal height is impossible, resulting in defective suction or mounting displacement. For this reason, in the component mounter 12 of this embodiment, maintenance operation, such as removing a foreign substance between the shaft member 32 and the nozzle holder 33, is performed regularly.

Figure 6:
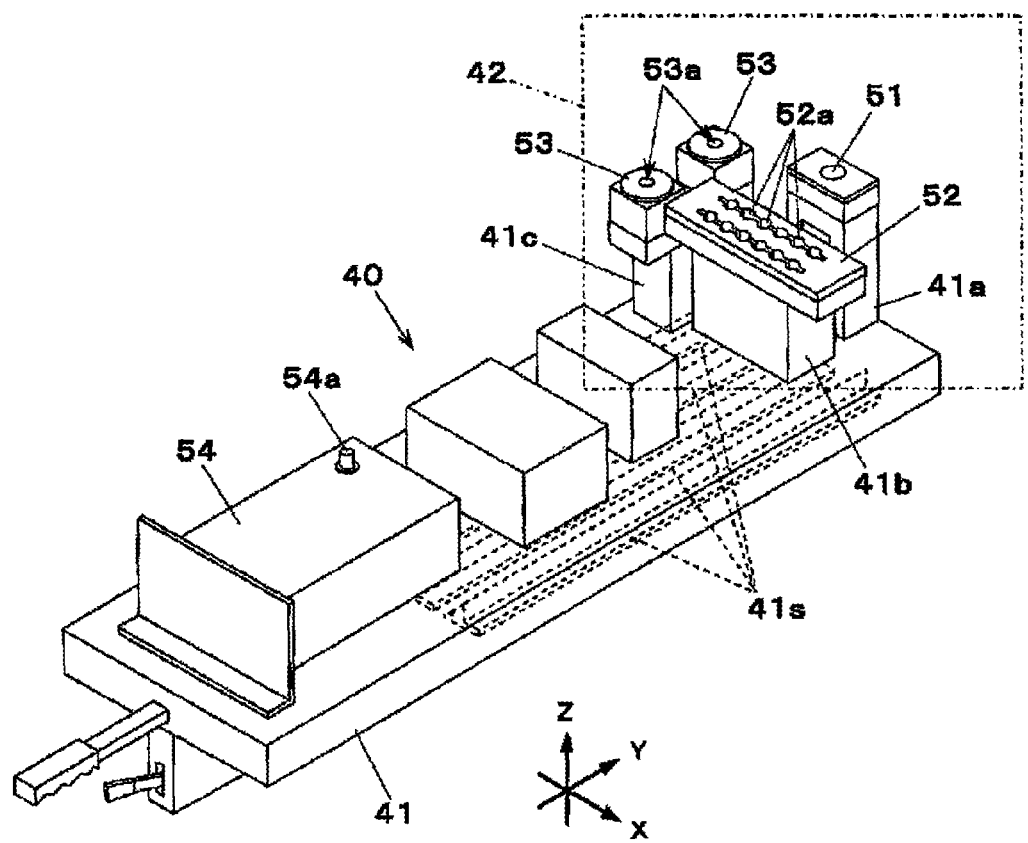
FIG. 6 is a perspective view of a head maintenance device according to the embodiment of the invention.
Figure 7:
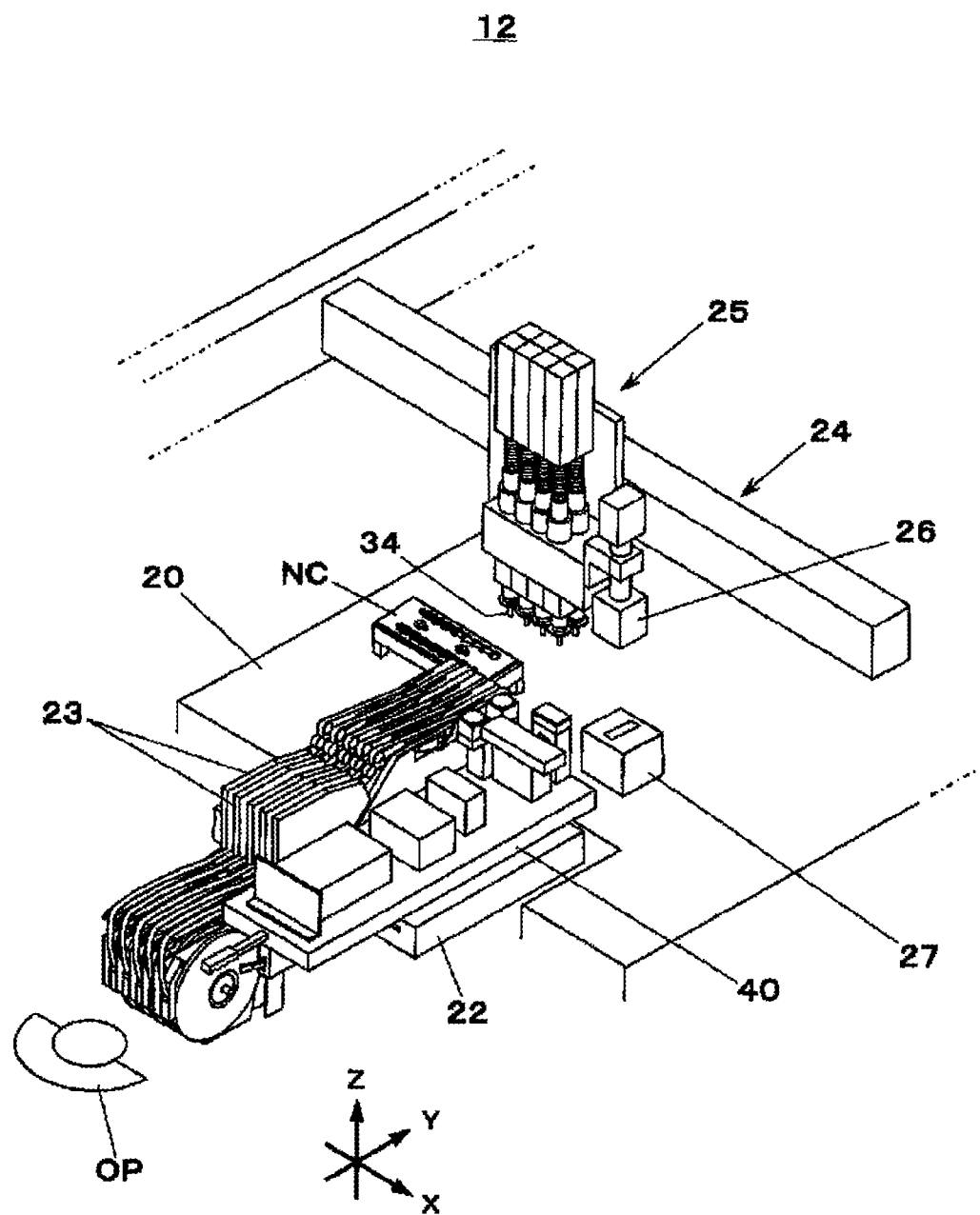
FIG. 7 is a perspective view of a main part of the component mounter in a state where the head maintenance device is attached to a feeder base according to the embodiment of the invention.

FIG. 6 shows a head maintenance device 40 which is used for maintenance of the mounting head 25 of the component mounter 12, and FIG. 7 shows a state where the head maintenance device 40 is attached to the feeder base 22 of the component mounter 12. In FIG. 6, the head maintenance device 40 includes a base portion 41 which is attached to the feeder base 22 as the holding portion of the parts feeder 23 to be replaceable with the parts feeder 23, and a maintenance execution unit 42 which is provided in the base portion 41 and executes maintenance for the mounting head 25. The maintenance execution unit 42 executes maintenance for the mounting head 25 (in detail, each shaft member 32) moved above the maintenance execution unit 42 by the head moving mechanism 24 (FIG. 7).

In FIG. 6, the base portion 41 of the head maintenance device 40 has a horizontal flat plate shape extending in the Y-axis direction, and slot inserting portions 41s which have an inverse "T"-shaped section and are insertable into the slots 22a of the feeder base 22 are provided to extend in the Y-axis direction in the lower surface of the base portion 41. Here, four slot inserting portions 41s are provided in parallel in the X-axis direction at an interval according to the interval between the slots 22a of the feeder base 22 in the lower surface of the base portion 41. The slot inserting portions 41s are inserted into the slots 22a of the feeder base 22. Here, of both end portions in the Y-axis direction of the head maintenance device 40 in a state of being attached to the feeder base 22, the end portion on the substrate conveyer 21 side is referred to as a front end portion, and the opposite end portion is referred to as a back end portion.

In FIG. 6, the maintenance execution unit 42 of the head maintenance device 40 is provided in a region on the front end portion side of the base portion 41, and includes a load cell 51, a nozzle holder attachment/detachment block 52, and shaft cleaners 53. The head maintenance device 40 includes a control unit 54, and the load cell 51 and the shaft cleaners 53 are electrically connected to the control unit 54.

In FIG. 5, the head maintenance device 40 has a maintenance-device-side connector 40a, and if the head maintenance device 40 is attached to the feeder base 22, the maintenance-device-side connector 40a is fitted to the above-described feeder base-side connector 22b, whereby signal transmission between the head maintenance device 40 and the control device 28 on the component mounter 12 side is enabled.

Figure 8:
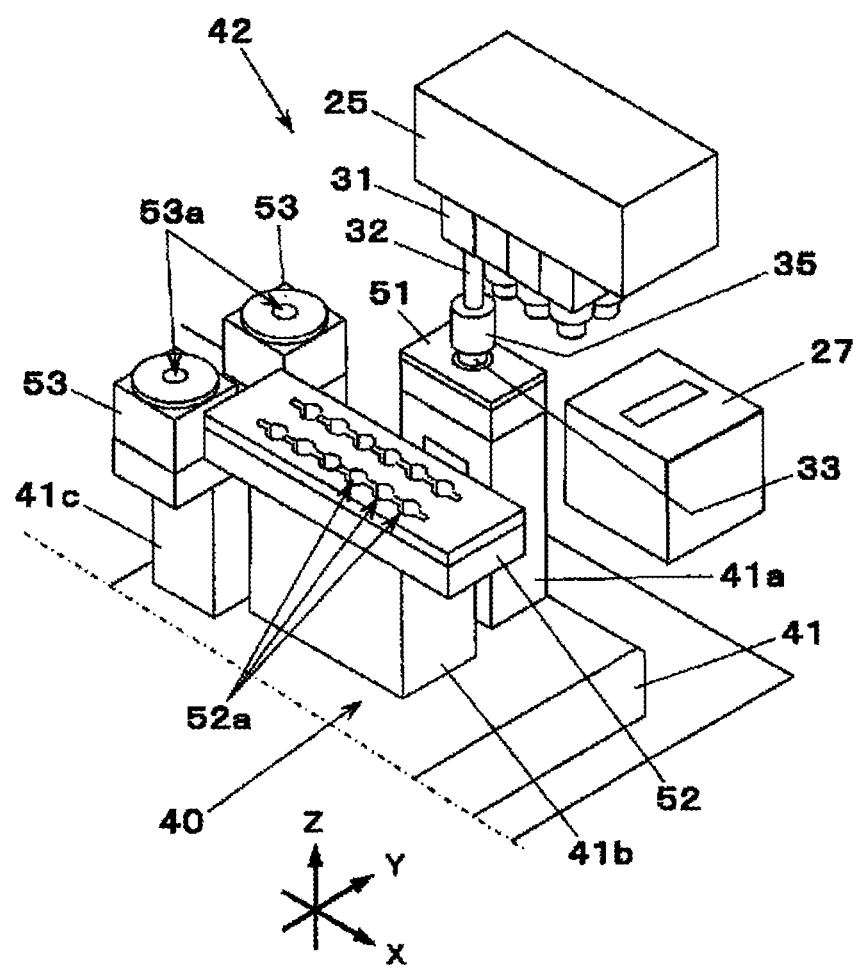
FIG. 8 is a partial enlarged perspective view of the head maintenance device according to the embodiment of the invention.

In FIG. 6, the load cell 51 is provided in a pedestal portion 41a provided erect in the foremost portion of the base portion 41, and the nozzle holder 33 is pressed by the shaft member 32 from the above in a state where the suction nozzle 34 is detached (FIG. 8). The load cell 51 detects a pressing load by the shaft member 32 and transmits the detected pressing load to the control unit 54 (FIG. 5).

When the sliding state of the nozzle holder 33 with respect to the shaft member 32 is bad, the value of the load detected by the load cell 51 increases. In the control unit 54 of the head maintenance device 40, a first reference load which is selected as a threshold value of a load is stored, and the control unit 54 determines the quality of the sliding state of the nozzle holder 33 with respect to the shaft member 32 under the first reference load based on whether or not the pressing load transmitted from the load cell 51 exceeds the first reference load (that is, based on the detected pressing load). Here, as the first reference load, a pressing load when it is expected that the nozzle holder 33 cannot be normally detached from the shaft member 32 is set. In the control unit 54 of the head maintenance device 40, a second reference load which is selected as a threshold value of a load when the use of the shaft member 32 is not suitable is stored, the control unit 54 determines the quality of the sliding state of the nozzle holder 33 with respect to the shaft member 32 under the second reference load based on whether or not the pressing load transmitted from the load cell 51 exceeds the second reference load (that is, based on the detected pressing load). The first reference load and the second reference load may have the same value.

In regard to the determination of the quality of the sliding state, although a method which measures a load when the nozzle holder 33 is pressed against the load cell 51 and performs determination has been described, the invention is not limited thereto, and the following method may be used.

The behavior of the nozzle holder 33 when pulling up the shaft member 32 pressed against the load cell 51 changes with the sliding state of the nozzle holder 33 with respect to the shaft member 32. When the sliding state is good, if the shaft member 32 is pulled up from the load cell 51, the nozzle holder 33 is pulled up so as to follow the shaft member 32 while remaining on the load cell 51 after the shaft member 32 is pulled up. That is, a load is still applied to the load cell 51 for a given time even after the shaft member 32 starts to be moved up. On the other hand, when the sliding state is bad, the nozzle holder 33 is pulled up along with the moving-up of the shaft member 32. That is, a load is not applied to the load cell 51 in a short time after the shaft member 32 starts to be moved up compared to the sliding state is good. Accordingly, it is possible to determine the quality of the sliding state by measuring a load which is applied to the load cell 51 when a predetermined time elapses after the shaft member 32 is pressed against the load cell 51 and then starts to be moved up. In this case, a third reference load is stored, and the quality of the sliding state is determined such that it is determined that the sliding state is good when the measured value of the load which is applied to the load cell 51 when a predetermined time elapses after the shaft member 32 is pressed against the load cell 51 and then moved up is greater than the third reference load, and conversely, it is determined that the quality of the sliding state is bad when the measured value is smaller than the third reference load.

That is, in this embodiment, the maintenance execution unit 42 includes the load cell 51 serving as pressing load detection means for detecting the pressing load when the nozzle holder 33 is pressed by the shaft member 32 in a state where the suction nozzle 34 is detached or when a predetermined time elapses after the nozzle holder 33 is pressed and then moved up, and the load cell 51 transmits the detected pressing load to the control unit 54 of the head maintenance device 40 serving as sliding state determination means for determining the sliding state of the nozzle holder 33 with respect to the shaft member 32 based on the pressing load. Namely, the control unit 54 performs inspection of the sliding states of the nozzle holders 33 (sliding member) with respect to the shaft members 32.

Figure 9A:
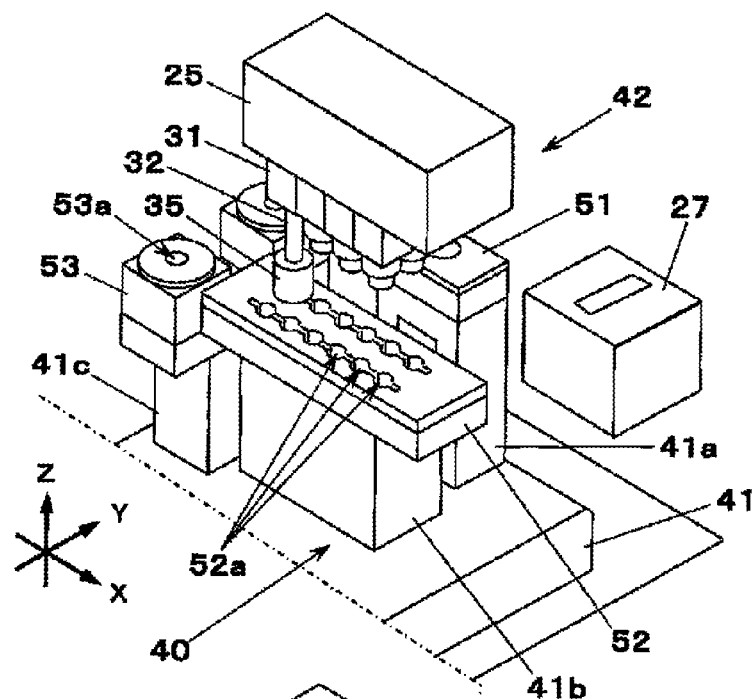
FIGS. 9A and 9B are partial enlarged perspective views of the head maintenance device according to the embodiment of the invention.
Figure 9B:
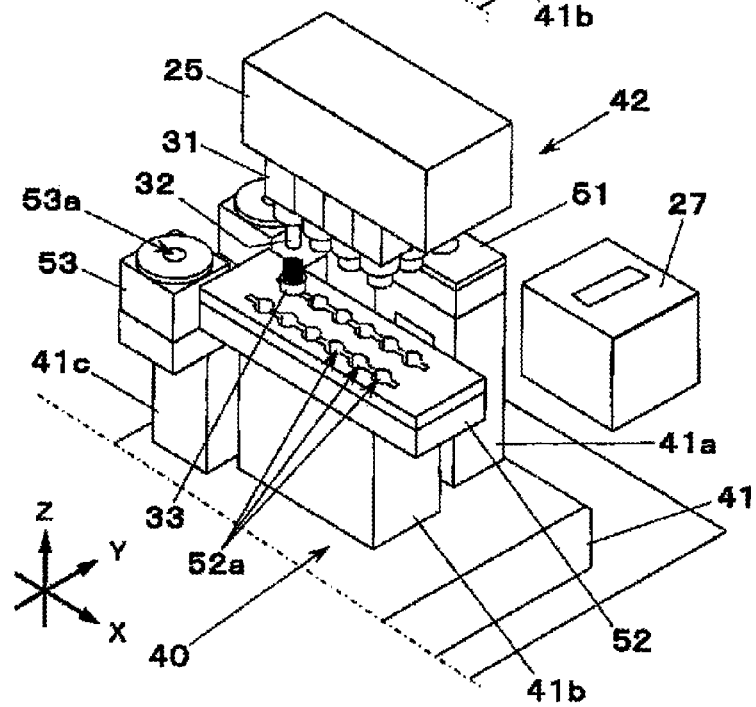

In FIG. 6, the nozzle holder attachment/detachment block 52 is made of a block-like member which is attached to an upper surface of a block portion 41b provided erect in the base portion 41, and the nozzle holder attachment/detachment block 52 is provided with a plurality of holder inserting holes 52a into which the lower end of the nozzle holder 33 is inserted. When detaching the nozzle holder 33 from the shaft member 32, the shaft member 32 to which the nozzle holder 33 to be detached is attached is positioned above the holder inserting hole 52a, the shaft member 32 is moved down to insert the nozzle holder 33 into the holder inserting hole 52a from the above (FIG. 9A). If the shaft member 32 is rotated around the vertical axis (Z axis), a protrusion (not shown) provided on the outer circumferential surface of the nozzle holder 33 is fitted to an engagement groove (not shown) formed in the inner lateral surface of the holder inserting hole 52a, and the shaft member 32 and the nozzle holder 33 are disengaged. For this reason, if the shaft member 32 is moved up from this state, the nozzle holder 33 is left within the holder inserting hole 52a and the nozzle holder 33 is detached from the shaft member 32 (FIG. 9B).

In this way, in this embodiment, the nozzle holder attachment/detachment block 52 becomes sliding member holding means for holding the nozzle holder 33 when detaching the nozzle holder 33 from the shaft member 32.

Figure 10:
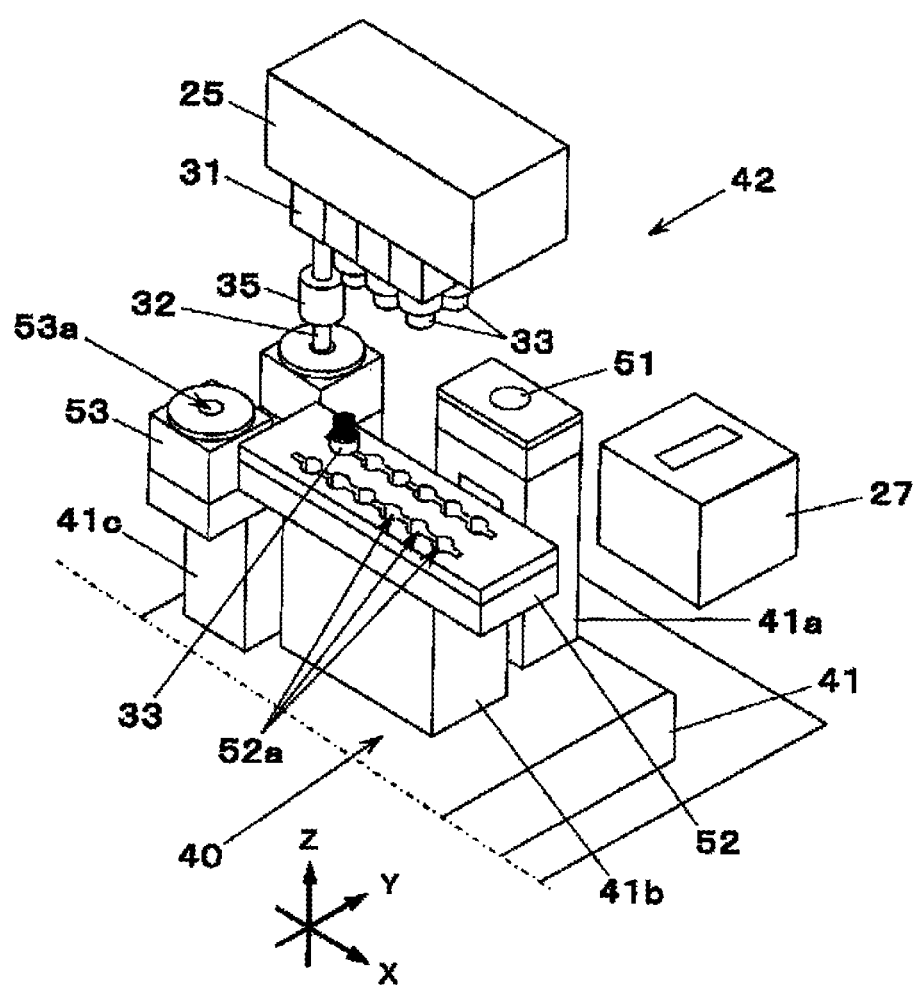
FIG. 10 is a partial enlarged perspective view of the head maintenance device according to the embodiment of the invention.

Two shaft cleaners 53 are provided in parallel in the Y-axis direction on the upper surface of a base 41c of the base portion 41. Each shaft cleaner 53 has a tubular configuration which is opened upward, and a portion to be slid and rubbed (not shown) is formed in the internal space 53a thereof. The shaft member 32 is repeatedly operated in the vertical direction and further repeatedly rotated by θ in both normal and reverse directions in a state where the shaft member 32 is inserted into the internal space 53a of the shaft cleaner 53 (FIG. 10), the outer circumferential surface and the bottom surface of the shaft member 32 (that is, the sliding portion between the shaft member 32 and the nozzle holder 33) is rubbed against the portion to be slid and rubbed. Accordingly, contaminant stuck to the outer circumferential surface and the bottom surface of the shaft member 32 is removed. Here, as the portion to be slid and rubbed, for example, various fiber materials, resins, or the like may be used.

In this way, in this embodiment, each shaft cleaner 53 becomes shaft member cleaning means for cleaning the sliding portion between the shaft member 32 and the nozzle holder 33 in a state where the nozzle holder 33 is detached.

Figure 11:
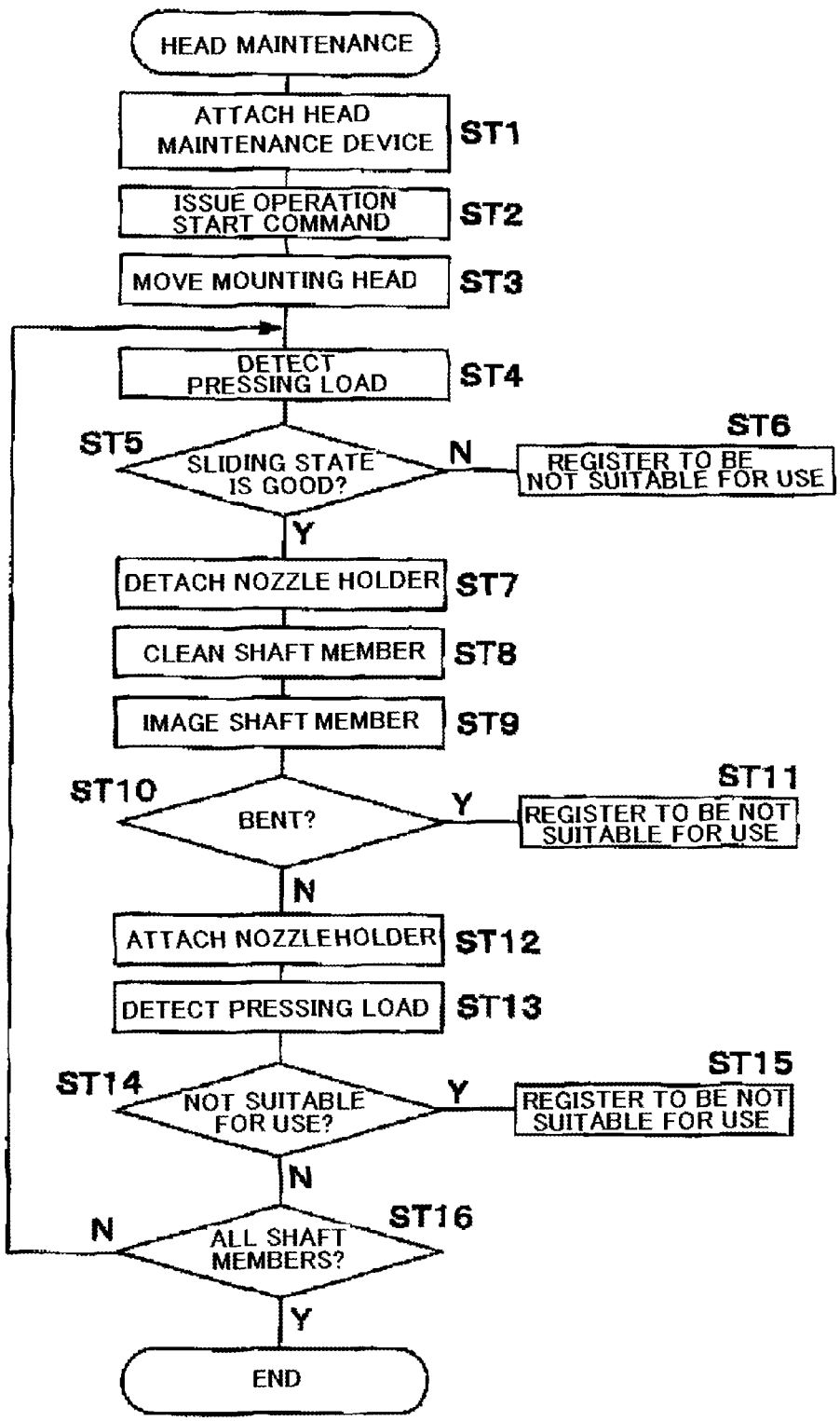
FIG. 11 is a flowchart showing an execution order of a head maintenance method using the head maintenance device according to the embodiment of the invention.

FIG. 11 is a flowchart showing the flow of maintenance (head maintenance method) of the mounting head 25 which is performed using the head maintenance device 40 attached to the feeder base 22. The maintenance of the mounting head 25 using the head maintenance device 40 is performed in a state where the suction nozzle 34 is detached from each of a plurality of shaft members 32 provided in the mounting head 25. The detachment of the suction nozzle 34 from the shaft member 32 is performed through access of the mounting head 25 to a nozzle changer NC (see FIGS. 2 and 7) provided on the base 20.

In the maintenance of the mounting head 25, first, the operator OP attaches the head maintenance device 40 to the feeder base 22 (a head maintenance device attachment process of Step ST1 shown in the flowchart of FIG. 11). If the head maintenance device 40 is attached to the feeder base 22, the operator OP operates an operation start command switch 54a (FIGS. 6 and 5) connected to the control device 28 of the component mounter 12 through the control unit 54 of the head maintenance device 40 to issue an operation start command of the maintenance execution unit 42 (an operation start command process of Step ST2). If it is detected that the operation start command switch 54a is operated, the control device 28 moves the mounting head 25 above the head maintenance device 40 (in detail, above the maintenance execution unit 42) attached to the feeder base 22 by the head moving mechanism 24 (a mounting head moving process of Step ST3). The operation start command of Step ST2 may be issued from the control device 28 side of the component mounter 12, or may be issued from, for example, an operating unit (not shown) of the component mounter 12.

If the mounting head 25 is moved above the head maintenance device 40, the control unit 28 moves one shaft member 32 to be currently subject to maintenance with the nozzle holder 33 attached thereto above the load cell 51, and moves down the shaft member 32 to press the nozzle holder 33 by the shaft member 32 in a state where the suction nozzle 34 is detached. The load cell 51 detects a load (the pressing load of the shaft member 32) according to the pressing force of the shaft member 32 (a pressing load detection process of Step ST4) and transmits data of the detected pressing load to the control unit 54 of the head maintenance device 40.

If data of the pressing load of the shaft member 32 is transmitted from the load cell 51, the control unit 54 determines the quality of the sliding state of the nozzle holder 33 with respect to the shaft member 32 based on the transmitted pressing load (that is, the pressing load detected by the load cell 51) of the shaft member 32 (a sliding state determination process of Step ST5). Specifically, when the pressing load detected by the load cell 51 exceeds the above-described first reference load, it is determined that the sliding state of the shaft member 32 is bad and the nozzle detachment of Step ST7 described below is unlikely to be normally performed.

In Step ST5, when it is determined that the sliding state of the nozzle holder 33 with respect to the shaft member 32 is bad under the first reference load, the control unit 54 transmits the identifier of the shaft member 32 to the control device 28 of the component mounter 12 with a flag to the effect that the sliding state is bad. When the flag to the effect that the sliding state is bad is attached to the identifier of the shaft member 32 transmitted from the control unit 54 of the head maintenance device 40, the control device 28 of the component mounter 12 displays the bad sliding state of the shaft member 32 on a display unit (not shown) provided in the component mounter 12 and places the maintenance operation in a standby state once. Here, for the shaft member 32 having the bad sliding state, a process for automatically detaching the nozzle holder 33 in Step ST7 described below is unlikely to be normally performed. Accordingly, the operator OP manually detaches the nozzle holder 33 for the shaft member 32 having the bad sliding state. Though not indispensable, the shaft member 32 having the bad sliding state may be registered to be not suitable for use (a not-suitable-for-use registration process of Step ST6). The registration of the shaft member 32 is performed such that the registration control unit 28a of the control device 28 stores the identifier of the shaft member 32 in the storage unit 28b of the control device 28 (FIG. 5).

On the other hand, in Step ST5, when it is determined that the sliding state of the nozzle holder 33 with respect to the shaft member 32 is not bad, the control unit 54 transmits the identifier of the shaft member 32 to be currently subject to maintenance to the control device 28 of the component mounter 12 with a flag to the effect that the sliding state is good. When the flag to the effect that the sliding state is good is attached to the identifier of the shaft member 32 transmitted from the control unit 54 of the head maintenance device 40, the control device 28 of the component mounter 12 moves the shaft member 32 above the nozzle holder attachment/detachment block 52 and detaches the nozzle holder 33 from the shaft member 32 by the above-described procedure (a nozzle holder detachment process of Step ST7).

After the nozzle holder 33 is detached from the shaft member 32 in Step ST7, it is determined in Step ST5 that the sliding state is bad, and the operator OP manually moves the shaft member 32 with the nozzle holder 33 detached therefrom in order above the shaft cleaners 53 (either of the two shaft cleaners 53), the control device 28 of the component mounter 12 moves down the shaft member 32 to insert the shaft member 32 into the internal space 53a of the shaft cleaner 53, and repeatedly rotates the shaft member 32 in the normal and reverse directions. Accordingly, the sliding portion between the shaft member 32 and the nozzle holder 33 is cleaned (a shaft member cleaning process of Step ST8). Contaminant stuck to the outer circumferential surface of the shaft member 32 is removed by cleaning the sliding portion between the shaft member 32 and the nozzle holder 33, and the sliding state of the nozzle holder 33 with respect to the shaft member 32 is good.

Figure 12:
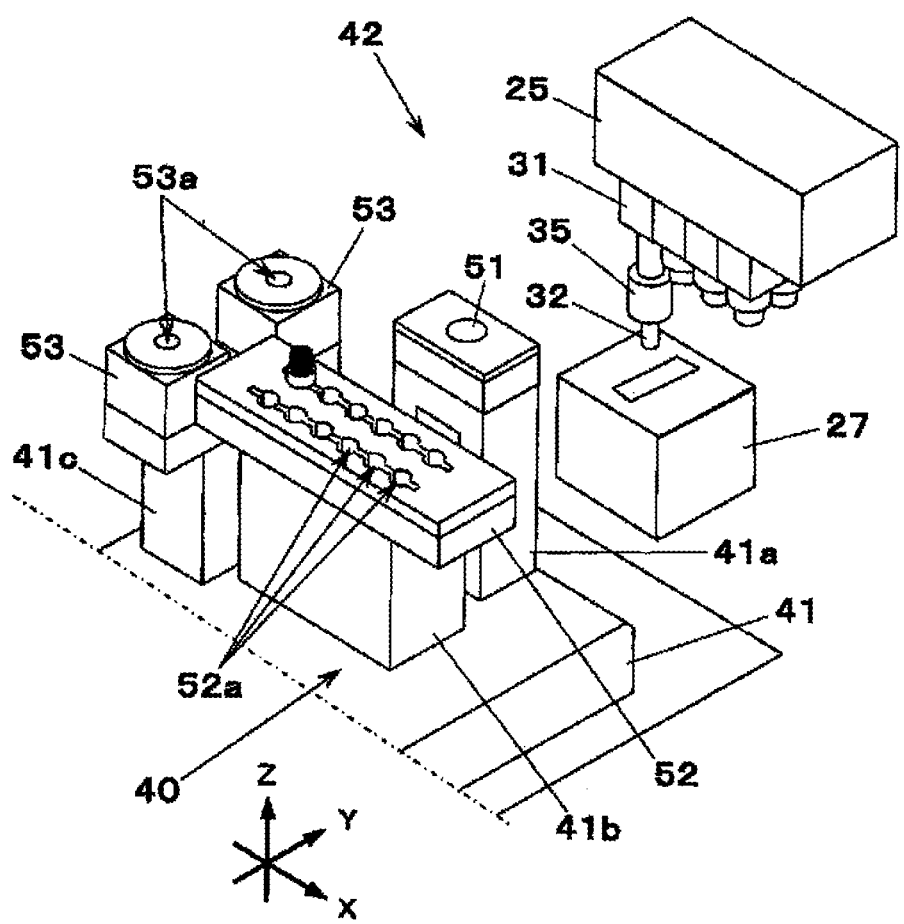
FIG. 12 is a partial enlarged perspective view of the head maintenance device according to the embodiment of the invention.

If the shaft member 32 to be currently subject to maintenance is cleaned, the control device 28 of the component mounter 12 moves the mounting head 25 above the component camera 27, and the shaft member 32 is imaged by the component camera 27 from below in a state where the nozzle holder 33 is detached (a shaft member imaging process of Step ST9, FIG. 12).

If the captured image of the shaft member 32 to be currently subject to maintenance is obtained, the control device 28 of the component mounter 12 performs inspection of the bending state (whether or not the shaft member 32 is bent) of the shaft member 32 based on this image (a shaft member bend inspection process of Step ST10). As a result, when it is detected that the shaft member 32 is bent out of an allowable range, the identifier of the shaft member 32 is transmitted to the control device 28 of the component mounter 12 with a flag to the effect that the shaft member 32 is bent. When the flag to the effect that the shaft member 32 is bent is attached to the identifier of the shaft member 32 transmitted from the control unit 54 of the head maintenance device 40, the registration control unit 28a of the control device 28 stores the identifier of the shaft member 32 in the storage unit 28b and registers the shaft member 32 to be not suitable for use (a not-suitable-for-use registration process of Step ST11).

On the other hand, in Step ST10, when it is detected that the shaft member 32 to be currently subject to maintenance is not bent out of the allowable range, the control device 28 of the component mounter 12 transmits the identifier of the shaft member 32 to the control device 28 of the component mounter 12 with a flag to the effect that the shaft member is not bent. When the flag to the effect that the shaft member 32 is not bent is attached to the identifier of the shaft member 32 transmitted from the control unit 54 of the head maintenance device 40, the control device 28 of the component mounter 12 attaches the nozzle holder 33 to the shaft member 32 (a nozzle holder attachment process of Step ST12).

Figure 13A:
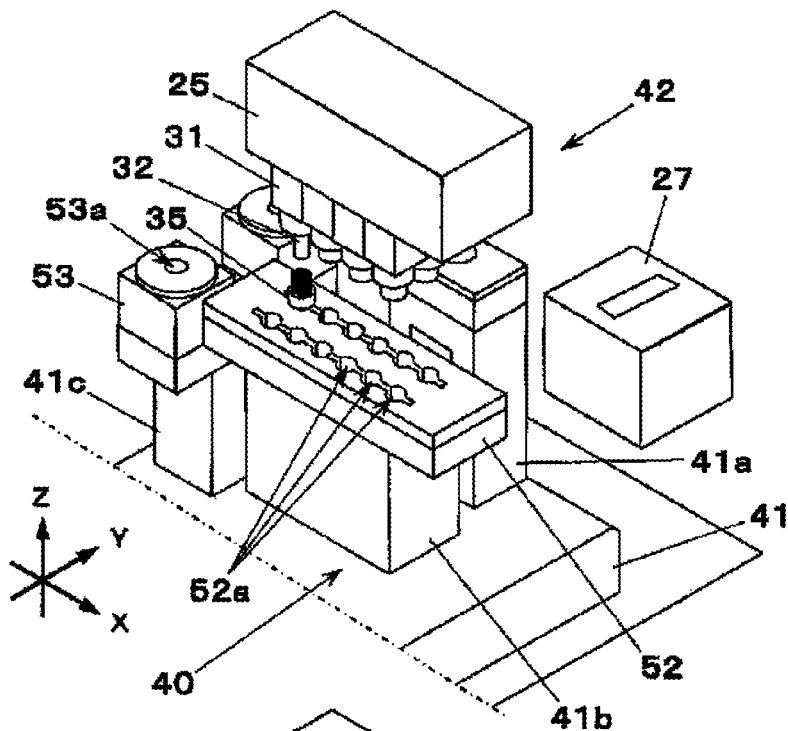
FIGS. 13A and 13B are partial enlarged perspective views of the head maintenance device according to the embodiment of the invention.
Figure 13B:
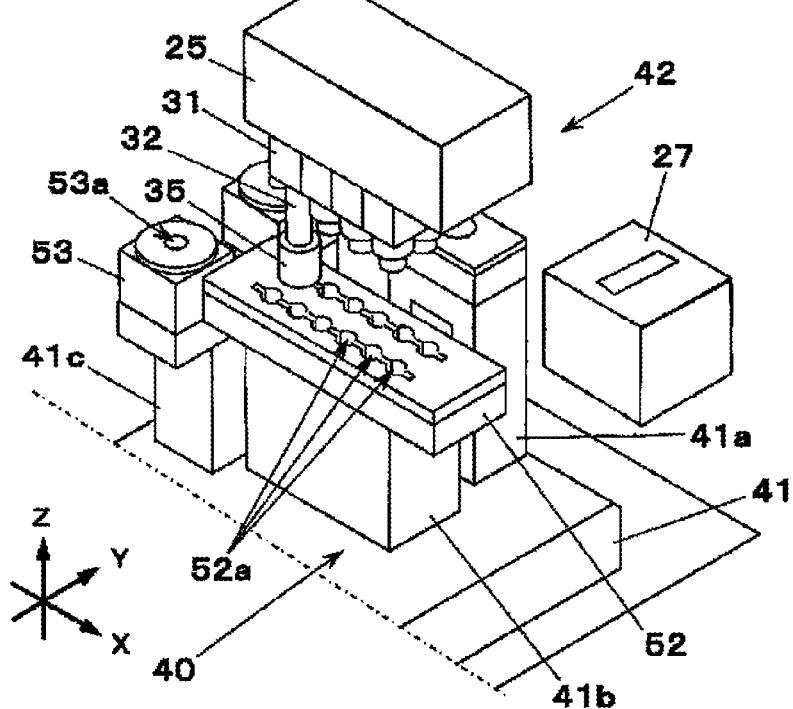

The attachment of the nozzle holder 33 to the shaft member 32 is performed by a procedure opposite to the procedure in the nozzle holder detachment process of Step ST7. That is, the control device 28 moves the shaft member 32 above the nozzle holder 33 to be attached to the shaft member 32 (FIG. 13A), moves down the shaft member 32 to insert the shaft member 32 into the holder inserting hole 52a of the nozzle holder 33 from the above (FIG. 13B), and rotates the shaft member 32 around the vertical axis (Z axis). Accordingly, the above-described protrusion (not shown) provided on the outer circumferential surface of the nozzle holder 33 is separated from the engagement groove engaged with the internal lateral surface of the holder inserting hole 52a, and the nozzle holder 33 is engaged with the shaft member 32. For this reason, if the shaft member 32 is moved up from this state, the nozzle holder 33 is moved upward out of the holder inserting hole 52a in a state of being attached to the shaft member 32.

If the nozzle holder 33 is attached to the shaft member 32 to be currently subject to maintenance, the control device 28 of the component mounter 12 moves the shaft member 32 above the load cell 51 and then moves down the shaft member 32 to press the nozzle holder 33 against the load cell 51 by the shaft member 32. The load cell 51 detects the pressing load of the shaft member 32 at this time and transmits data of the detected pressing load to the control unit 54 of the head maintenance device 40 (a pressing load detection process of Step ST13).

If data of the pressing load of the shaft member 32 is transmitted from the load cell 51, a use suitability determination unit 28c (FIG. 5) of the control device 28 determines whether or not the use of the shaft member 32 is suitable based on the pressing load. Specifically, when the pressing load detected by the load cell 51 exceeds the above-described second reference load selected as a threshold value of a load when the use of the shaft member 32 is not suitable, it is determined that the sliding state of the shaft member 32 is bad and the shaft member 32 is not suitable for use (a use suitability determination process of Step ST14).

In this way, the load cell 51 and the control unit 54 of the head maintenance device 40 of this embodiment become an inspection section that inspects a state of each shaft member 32 undergone the maintenance by the maintenance execution unit 42. The use suitability determination unit 28c of the control device 28 becomes a use suitability determination section that determines whether or not the use of the mounting head 25 (shaft member 32) undergone the maintenance is suitable based on the results of inspection of Step ST12 to Step ST14 by the load cell 51 and the control unit 54 as the inspection unit.

In Step ST14, when it is determined that the sliding state of the shaft member 32 to be currently subject to maintenance after the execution of the maintenance is bad under the second reference load and the shaft member 32 is not suitable for use, the control unit 54 transmits the identifier of the shaft member 32 to the control device 28 of the component mounter 12 with a flag to the effect that the shaft member 32 is not suitable for use. When the flag to the effect that the shaft member 32 is not suitable for use is attached to the identifier of the shaft member 32 transmitted from the control unit 54 of the head maintenance device 40, the registration control unit 28a of the control device 28 of the component mounter 12 stores the identifier of the shaft member 32 in the storage unit 28b and registers the shaft member 32 to be not suitable for use (a not-suitable-for-use registration process of Step ST15).

In this way, in this embodiment, the registration control unit 28a and the storage unit 28b of the control device 28 become a registration section that registers the mounting head 25 (in detail, the shaft member 32) determined to be not suitable for use by the use suitability determination unit 28c of the control device 28 serving as a use suitability determination section.

On the other hand, in Step ST14, when it is determined that the target shaft member 32 is suitable for use, the control unit 54 transmits the identifier of the shaft member 32 to the control device 28 of the component mounter 12 with a flag to the effect that the shaft member 32 is suitable for use. When the flag to the effect that the shaft member 32 is suitable for use is attached to the identifier of the shaft member 32 transmitted from the control unit 54 of the head maintenance device 40, the control device 28 of the component mounter 12 ends the maintenance of the shaft member 32 and determines whether or not maintenance is performed for all shaft members 32 provided in the mounting head 25 (a determination process of Step ST16). When maintenance is not performed for all shaft members 32, the process returns to Step ST4, the process (a maintenance execution process in which maintenance is executed by the head maintenance device 40 for the mounting head 25) of Step ST4 to Step ST16 is performed for the shaft member 32 in which maintenance is not yet performed. On the other hand, in Step ST16, when maintenance is performed for all shaft members 32, the control device 28 ends the maintenance operation of the mounting head 25.

Although the control device 28 of the component mounter 12 ends the maintenance operation of the mounting head 25 and then performs the mounting operation of the components 4 on the substrate 2, when a shaft member 32 which is not suitable for use is registered (stored) in the storage unit 28b, the shaft member 32 which is registered to be not suitable for use is not used in the mounting operation of the components 4. That is, the component mounter 12 restricts the use of the shaft member 32 (that is, the use of the mounting head 25) registered by the registration section (the registration control unit 28a and the storage unit 28b of the control device 28).

As described above, in the component mounter 12 of this embodiment, the head maintenance device 40 which performs the maintenance of the mounting head 25 is attached to the feeder base 22 to be replaceable with the parts feeder 23, and maintenance is executed for the mounting head 25 moved upward by the head moving mechanism 24. For this reason, an operation to detach the mounting head 25 from the head moving mechanism 24 at the time of the maintenance of the mounting head 25 is not required, and it is possible to easily perform maintenance in a short time.

In the maintenance method of this embodiment, the head maintenance device 40 which performs the maintenance of the mounting head 25 is attached to the feeder base 22 to be replaceable with the parts feeder 23, and maintenance is executed for the mounting head 25 moved upward by the head moving mechanism 24. For this reason, an operation to detach the mounting head from the head moving mechanism 24 at the time of the maintenance of the mounting head 25 is not required, and it is possible to easily perform maintenance in a short time.

In the component mounting system 1 of this embodiment, after the maintenance of the mounting head 25 provided in the component mounter 12 is executed by the head maintenance device 40, the inspection (Step ST12 to Step ST14 in the above-described maintenance operation) of the state of the mounting head 25 is performed, and as a result, the mounting head 25 determined to be not suitable for use is registered (Step ST15) and the use of the mounting head 25 is restricted. For this reason, it is possible to prevent degradation in mounting precision of the components 4 even when the maintenance of the mounting head 25 of the component mounter 12 is insufficient.

Although the embodiment of the invention has been hitherto described, the invention is not limited to that described in the above-described embodiment. For example, in the above-described embodiment, although the destination where a shaft member 32 determined to be not suitable for use is registered is the storage unit 28b of the control device 28 provided in the component mounter 12, the invention is not particularly limited thereto, and other storage means, such as the storage unit (not shown) of the host computer 14, may be used.

In the above-described embodiment, although the maintenance of the shaft members 32 is cleaning of the sliding state between the shaft members 32 and the nozzle holder 33 (sliding member) or inspection of the bending state of the shaft members 32, other kinds of maintenance, for example, washing of the inside of the shaft members 32 and the like may be performed.

It is possible to provide a component mounting system capable of preventing degradation in mounting precision of components even when there is a shaft member undergone insufficient maintenance in a mounting head of a component mounter.

What is claimed is:

1. A component mounting system comprising:
    a component mounter that moves a mounting head by a head moving mechanism and allows a suction nozzle mounted in the mounting head to suck a component supplied by a parts feeder to mount the component on a substrate;
    a head maintenance device that executes maintenance of the mounting head;
    an inspection section that inspects a state of the mounting head after undergone undergoing the maintenance by the head maintenance device;
    a use suitability determination section that determines whether or not use of the mounting head after undergoing maintenance by the head maintenance device is suitable based on a result of the inspection by the inspection section; and
    a registration section that registers the mounting head determined to be not suitable for use by the use suitability determination section,
    wherein use of the mounting head registered by the registration section is restricted in the component mounter,
    the mounting head has a shaft member and a sliding member slidably attached to the shaft member,
    the inspection section comprises a load cell and a control unit, the load cell detects a pressing load of the sliding member onto the load cell, and the control unit determines a quality of a sliding state of the sliding member with respect to the shaft member based on the detected pressing load.

2. The component mounting system according to claim 1, wherein
    the mounting head has a plurality of shaft members and sliding members slidably attached to the shaft members,
    the maintenance which is executed by the head maintenance device is cleaning of an outer circumferential surface of the shaft member, and
    the inspection which is performed by the inspection section is inspection of sliding states of the sliding members with respect to the shaft members.

3. The component mounting system according to claim 1, wherein the component mounter further comprises a feeder base that holds the parts feeder, and wherein the head maintenance device is replaced with the parts feeder and attached to the feeder base.

4. The component mounting system according to claim 2, wherein the component mounter further comprises a feeder base that holds the parts feeder, and wherein the head maintenance device is replaced with the parts feeder and attached to the feeder base.

* * * * *